(12) United States Patent
Bailly et al.

(10) Patent No.: US 11,189,664 B2
(45) Date of Patent: Nov. 30, 2021

(54) RADIATION DETECTION DEVICE COMPRISING ORGANIC PHOTODIODES

(71) Applicant: ISORG, Limoges (FR)

(72) Inventors: Adrien Bailly, Limoges (FR); Emeline Saracco, Limoges (FR); Benjamin Bouthinon, Limoges (FR); Franck Hingant, Limoges (FR)

(73) Assignee: ISORG, Limoges (FR)

( * ) Notice: Subject to any disclaimer, the term of this patent is extended or adjusted under 35 U.S.C. 154(b) by 94 days.

(21) Appl. No.: 16/606,583

(22) PCT Filed: Apr. 19, 2018

(86) PCT No.: PCT/FR2018/050982
§ 371 (c)(1),
(2) Date: Oct. 18, 2019

(87) PCT Pub. No.: WO2018/193216
PCT Pub. Date: Oct. 25, 2018

(65) Prior Publication Data
US 2021/0118954 A1    Apr. 22, 2021

(30) Foreign Application Priority Data
Apr. 20, 2017  (FR) ..................................... 17/53424

(51) Int. Cl.
*H01L 27/30* (2006.01)
*H01L 51/00* (2006.01)
*H01L 51/44* (2006.01)

(52) U.S. Cl.
CPC ........ *H01L 27/307* (2013.01); *H01L 51/0037* (2013.01); *H01L 51/448* (2013.01)

(58) Field of Classification Search
None
See application file for complete search history.

(56) References Cited

U.S. PATENT DOCUMENTS

2013/0070131 A1    3/2013  Ohkubo et al.
2019/0378880 A1*  12/2019  Zalar .................... H01L 27/146

FOREIGN PATENT DOCUMENTS

DE    102012220056 A1    2/2014
JP    2004-022908 A    1/2004

OTHER PUBLICATIONS

Authorized Officer: Fratiloiu, Silvia, International Search Report issued in counterpart PCT application No. PCT/FR2018/050982, dated Jul. 18, 2018, 2 pp.
Authorized Officer Silvia Fratiloiu, English Translation of the Written Opinion of the International Searching Authority dated Jul. 18, 2018 issued in PCT Application No. PCT/FR2018/050982.

* cited by examiner

*Primary Examiner* — Dung A. Le
(74) *Attorney, Agent, or Firm* — Kaplan Breyer Schwarz, LLP

(57) ABSTRACT

A device for detecting an electromagnetic radiation has at least one photodetector including an organic diode and an organic photodiode formed in a same stack of semiconductor layers, the organic photodiode receiving the radiation. The photodetector further includes at least one screen which is opaque to the radiation and screens the portion of the stack corresponding to the diode.

11 Claims, 4 Drawing Sheets

RADIATION DETECTION DEVICE COMPRISING ORGANIC PHOTODIODES

The present patent application claims the priority benefit of French patent application FR17/53424 which is herein incorporated by reference.

BACKGROUND

The present disclosure relates to a device for detecting an electromagnetic radiation, particularly light, comprising an array of organic photodiodes.

DISCUSSION OF THE RELATED ART

It has already been provided to form devices for detecting an electromagnetic radiation comprising transistors and photodiodes based on organic conductor and semiconductor materials. Such materials have the advantage of being easier to deposit and more resistant than inorganic conductor and semiconductor materials, for example, silicon.

The use of organic materials further advantageously enables to form the detection device on any types of support and, in particular, on flexible supports such as plastic, paper, cardboard, or fabric, on supports of large dimensions, for example, signboards, or on disposable supports such as convenience good packages.

The detection device may comprise an array of photodetectors arranged in rows and in columns. Each photodetector may comprise an organic photodiode series-assembled with an electronic component enabling to select the associated photodiode on control of the selection device. The selection elements may be organic thin film transistors (OTFT).

A disadvantage is that the method of manufacturing the detection device may then comprise a significant number of steps, particularly the organic photodiode manufacturing steps and the organic transistor manufacturing steps.

SUMMARY

An object of an embodiment is to overcome all or part of the disadvantages of previously-described electromagnetic radiation detection devices comprising organic photodiodes.

Another object of an embodiment is to decrease the number of steps of the detection device manufacturing method.

Thus, an embodiment provides an electromagnetic radiation detection device comprising at least one photodetector comprising an organic diode and an organic photodiode formed in a same stack of semiconductor layers, the organic photodiode receiving said radiation, the photodetector further comprising at least one screen opaque to said radiation and screening the portion of the stack corresponding to the diode.

According to an embodiment, the anode of the diode is connected to the anode of the photodiode or the cathode of the diode is connected to the cathode of the photodiode.

According to an embodiment, the device comprises a support, a first conductive portion extending over the support, and a second conductive portion extending over the support, the stack at least partially covering the first conductive portion and at least partially covering the second conductive portion, the minimum distance between the first conductive portion and the second conductive portion being greater than 10 nm.

According to an embodiment, the opaque screen is located on the side of the support opposite to the first and second conductive portions.

According to an embodiment, the first conductive portion is at least partially transparent to the radiation and the second conductive portion is opaque to the radiation.

According to an embodiment, the device further comprises an insulating layer covering the stack, the opaque screen being located on the insulating layer, on the side of the insulating layer opposite to the stack.

According to an embodiment, the device further comprises a conductive element extending over the insulating layer and through the insulating layer, the conductive element being in contact with the first conductive portion or with the second conductive portion, the conductive element further forming the opaque screen.

According to an embodiment, the device comprises an array of photodetectors distributed in rows and in columns.

According to an embodiment, the stack comprises at least first, second, and third semiconductor layers, the second semiconductor layer being interposed between the first semiconductor layer and the third semiconductor layer and being in contact with the first semiconductor layer and with the third semiconductor layer, the second semiconductor layer being the layer having most of the radiation received by the photodiode captured therein.

According to an embodiment, the first semiconductor layer is in contact with the first conductive portion and with the second conductive portion.

According to an embodiment, the first semiconductor layer and/or the third semiconductor layer is made of a material selected from the group comprising:
- a metal oxide, particularly a titanium oxide or a zinc oxide;
- a molecular host/dopant system, particularly the products commercialized by Novaled under trade names NET-5/NDN-1 or NET-8/MDN-26;
- a conductive or doped semiconductor polymer, for example, the PEDOT:Tosylate polymer, which is a mixture of poly(3,4)-ethylenedioxythiophene and of tosylate;
- a carbonate, for example $CsCO_3$;
- a polyelectrolyte, for example, poly[9,9-bis(3'-(N,N-dimethylamino)propyl)-2,7-fluorene-alt-2,7-(9,9-dioctyfluorene)] (PFN), poly[3-(6-trimethylammoniumhexyl] thiophene (P3TMAHT) or poly[9,9-bis(2-ethylhexyl)fluorene]-b-poly[3-(6-trimethylammoniumhexyl] thiophene (PF2/6-b-P3TMAHT);
- a polyethyleneimine (PEI) polymer or a polyethyleneimine ethoxylated (PEIE), propoxylated and/or butoxylated polymer; and
- a mixture of two or more of these materials.

BRIEF DESCRIPTION OF THE DRAWINGS

The foregoing and other features and advantages will be discussed in detail in the following non-limiting description of specific embodiments in connection with the accompanying drawings, in which.

DETAILED DESCRIPTION

Figure 1:
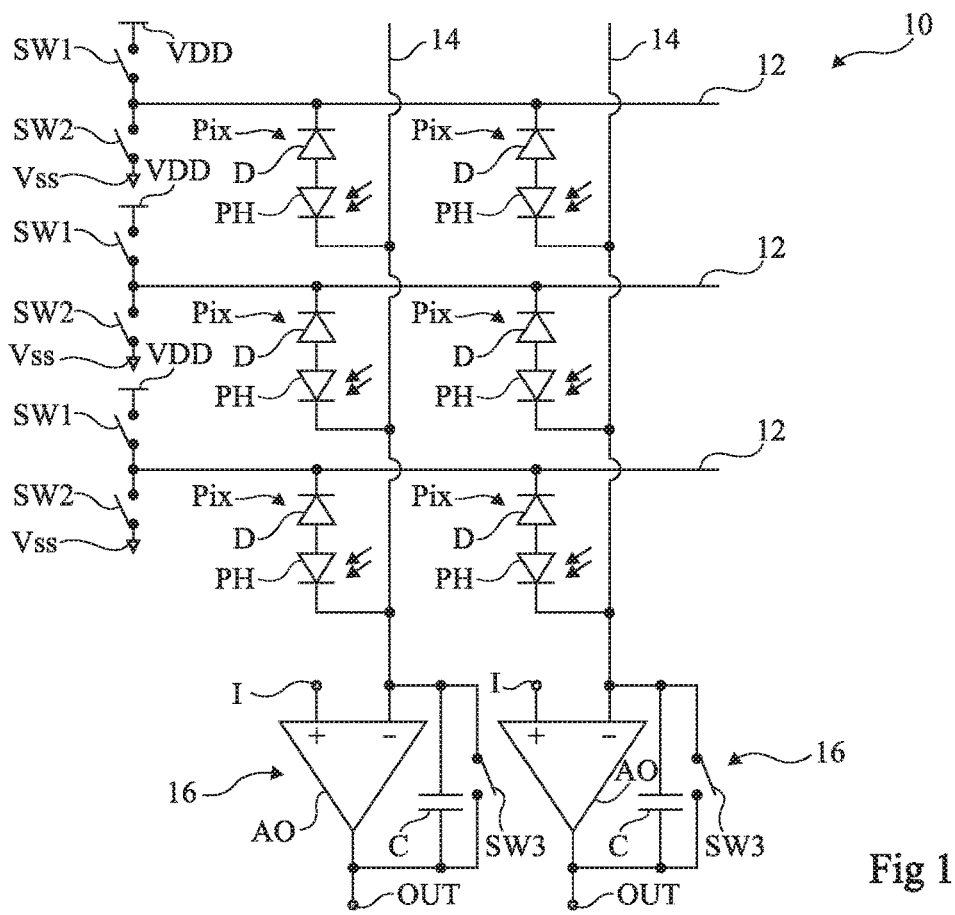
FIG. 1 is an electric diagram of an electromagnetic radiation detection device comprising an array of organic photodetectors.

For clarity, the same elements have been designated with the same reference numerals in the various drawings and, further, the various drawings are not to scale. Further, only those elements which are useful to the understanding of the described embodiments have been shown and are described. In particular, the means for processing the signals supplied by the detection device described hereafter are within the abilities of those skilled in the art and are not described. In the following description, the terms "substantially", "approximately", and "in the order of" are used herein to designate a tolerance of plus or minus 10% of the value in question. In the following description, an electronic component is called "organic" when at least a majority of the materials forming it are organic. In the following description, "active area" of a photodiode designates the layer of the photodiode where most of the conversion of the electromagnetic radiation received by the photodiode into an electric signal occurs.

An embodiment provides a device for detecting an electromagnetic radiation, particularly in a wavelength range between 400 nm and 1,000 nm, comprising an array of organic photodetectors where each photodetector comprises an organic photodiode and a selection element corresponding to an organic diode, different from a light-emitting diode, the anode of the diode being connected to the anode of the photodiode or the cathode of the diode being connected to the cathode of the photodiode. The photodiode and the diode are formed by a stack of semiconductor organic layers which are common for the diode and the photodiode. An opaque screen prevents the radiation received by the photodetector from reaching a portion of the stack. The portion of the stack which is not illuminated operates as a diode and the portion of the stack which is illuminated operates as a photodiode. The stack covers two conductive portions which are sufficiently spaced apart to impose a main direction of circulation of the charges in the stack. The layer of the stack at the end of the stack opposite to the conductive portions forms the common electrode between the diode and the photodiode.

Further, the structure of the detection device is simpler than that of a detection device comprising an array of organic photodiodes and of selection transistors. The detection device manufacturing method is, further, simplified. Indeed, the steps of forming the photodiode and the selection diode are confounded.

FIG. 1 is an electric diagram of an embodiment of a device 10 for detecting an electromagnetic radiation, for example, light, comprising an array of photodetectors Pix arranged in rows and in columns. FIG. 1 shows three rows and two columns as an example. Each photodetector Pix comprises a photodiode PH and a selection diode D assembled in series. In the present embodiment, the anode of diode D is connected to the anode of the associated photodiode PH. The cathode of diode D is connected to a conductive track 12 which extends along the row associated with photodetector Pix and the cathode of photodiode PH is connected to a conductive track 14 which extends along the column associated with photodetector Pix.

Each conductive track 12 may be coupled, by a switch SW1, to a source of a high reference potential VDD which may be in the range from 1 V to 10 V or, by a switch SW2, to a source of a low reference potential Vss, which may be in the range from 0 V to −10 V, for example, the ground. In the following description, it is considered that the low reference potential is equal to 0 V and that the high reference potential is equal to VDD, for example, substantially 5 V. Switches SW1 and SW2 are controlled by a control unit, not shown. Each conductive track 14 is coupled to a readout circuit 16. According to an embodiment, each readout circuit 16 comprises an operational amplifier AO assembled as an integrator. The inverting input (−) of operational amplifier AO is coupled to conductive track 14. The non-inverting input (+) de of operational amplifier AO is coupled to a node I maintained, in operation, at an intermediate potential between the high reference potential and the low reference potential, for example, at VDD/2. Output OUT of operational amplifier AO is coupled to the inverting input (−) of operational amplifier AO by a capacitor C. A switch SW3 is assembled in parallel across capacitor C and enables, when it is on, to discharge capacitor C.

Detection device 10 operates as follows. The selection of photodiodes PH is performed row by row. For each row which is not selected, the conductive track 12 of the row is maintained substantially at VDD. Since the potential at the inverting input (−) of each comparator AO is at VDD/2, each diode D of the non-selected row is reverse-biased while each photodiode PH of the non-selected row is forward-biased. The current flowing through the photodetector then corresponds to the reverse current or dark current of diode D, which is very low, for example, smaller than $10^{-10}$ A. The selection of the photodiodes PH of a row is obtained by coupling the conductive track 12 of the selected row to ground GND. Each diode D of the selected row is then forward-biased while each photodiode PH of the selected row is reverse-biased. The current flowing through the photodetector corresponds to the reverse current of photodiode PH and depends on the radiation received by photodiode PH. The current flowing on each track 14 is equal to the sum of the current supplied by the photodetector Pix of the selected row and of the dark currents of the diodes D of the other non-selected rows.

Figure 2:
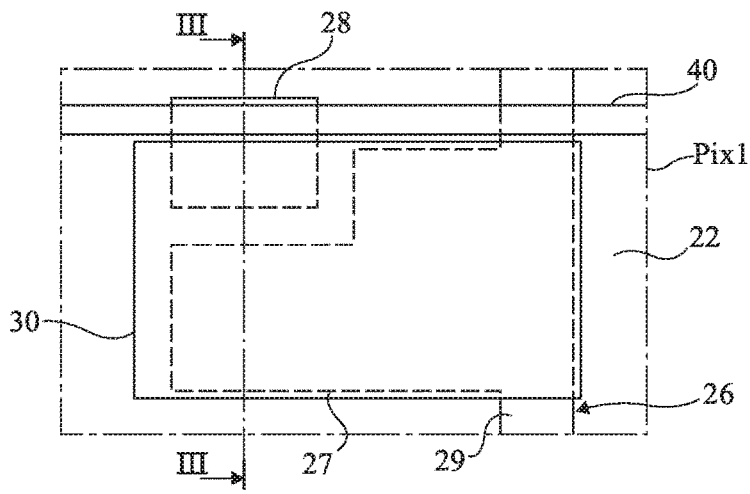
FIGS. 2 and 3 respectively are a top view and a cross-section view, partial and simplified, of an embodiment of a photodetector of the detection device of FIG. 1.
Figure 3:
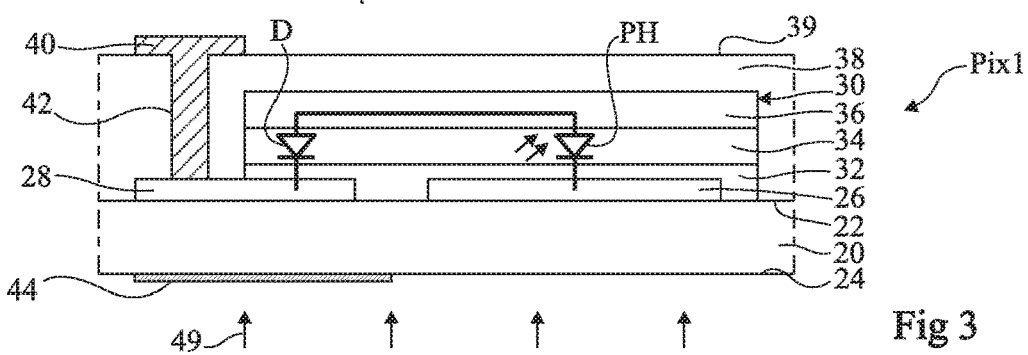

FIG. 2 is a partial simplified top view of an embodiment of a photodetector Pix1 which may correspond to one of the photodetectors Pix of detection device 10. FIG. 3 is a cross-section view of FIG. 2 along line III-III. FIG. 2 shows in dotted lines the circumference of a conductive or semiconductor portion covered, in top view, with another conductive or semiconductor portion.

Photodetector Pix1 comprises:
 a support 20 comprising two opposite surfaces 22, 24;
 first and second separate electrically conductive portions 26, 28 extending on surface 22, first conductive portion 26 comprising a portion 27 forming an electrode of photodiode PH and a portion 29 forming conductive track 14;
 a stack 30 of semiconductor layers comprising a first interface layer 32 covering a portion of first conductive portion 26, a portion of second conductive portion 28, and a portion of support 20 between conductive portions 26, 28, an active layer 34 covering interface layer 32 and a second interface later 36 covering active layer 34;

an electrically insulating layer 38 comprising a surface 39 opposite to support 20 and covering interface layer 36, the portions of conductive portions 26, 28 which are not covered with stack 30, and the portions of support 20 which are not covered with stack 30 and conductive portions 26, 28;

an electrically conductive element 40 extending on surface 39 of insulating layer 38 to form conductive track 12 and further extending in an opening 42 crossing insulating layer 38 to come into contact with second conductive portion 28; and a region 44, opaque to the radiation detected by device 10, and covering the surface 24 of support 20 opposite a portion of stack 30.

Figure 4:
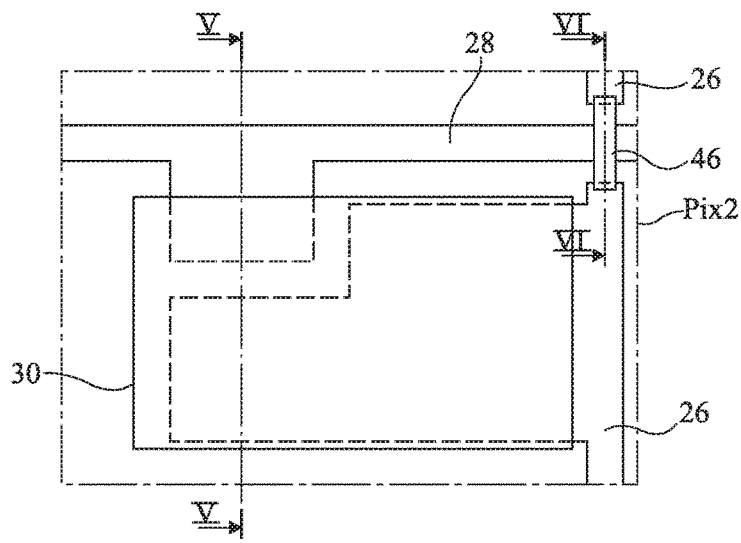
FIGS. 4, 5, and 6 respectively are a top view and two cross-section views, partial and simplified, of another embodiment of a photodetector of the detection device of FIG. 1.
Figure 5:
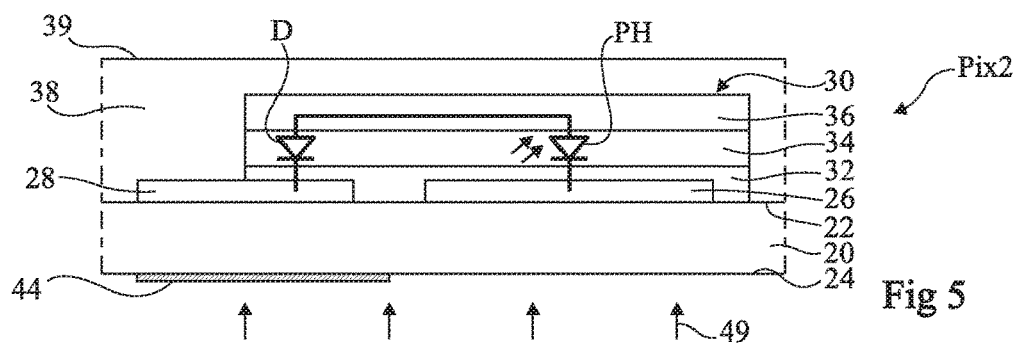
Figure 6:
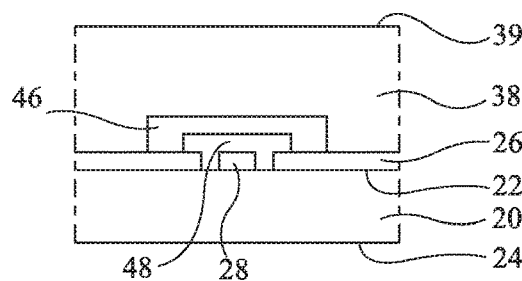

FIG. 4 is a partial simplified top view of another embodiment of a photodetector Pix2 capable of corresponding to one of the photodetectors Pix of detection device 10. FIG. 5 is a cross-section view of FIG. 4 along line V-V and FIG. 6 is a cross-section of FIG. 4 along line VI-VI. FIG. 4 shows in dotted lines the contour of a conductive or semiconductor portion covered, in top view, with another conductive or semiconductor portion.

The photodetector Pix2 shown in FIGS. 4 to 6 comprises all the elements of the photodetector Pix1 shown in FIGS. 2 and 3, with the difference that conductive element 40 is not present and that conductive track 12 is formed by conductive portion 28. The crossing between conductive portions 26 and 28 is performed by interrupting conductive portion 26 and by providing a conductive bridge 46 which couples the two separate portions of conductive portion 26 and which spans conductive portion 28. Conductive bridge 46 is electrically insulated from conductive portion 28 by an insulating region 48.

According to a variation of photodetector Pix2, interface layer 32 and active layer 34 may advantageously extend over the entire surface of photodetector Pix2.

Support 20 may be made of a dielectric material. Support 20 may be a rigid support, for example, made of glass. Support 20 may be a flexible support, for example, made of a polymer or of a metallic material. Examples of polymer are poly-ethylene naphthalene (PEN), polyethylene terephthalate (PET), kapton, and polyetheretherketone (PEEK). The thickness of support 20 is for example in the range from 20 µm to 1 cm, for example, approximately 125 µm. Support 20 may be made of a transparent or translucent material, for example, of glass or of plastic, particularly in the case where device 10 is intended to receive an illumination on the side of surface 24.

Conductive portions 26 and 28 may be made of a conductive and transparent material, for example, of transparent conductive oxide or TCO, of carbon nanotubes, of graphene, of a conductive polymer, of a metal, or of a mixture or an alloy of at least two of these compounds. Conductive portions 26 and 28 may have a multilayer structure.

Examples of TCOs capable of forming conductive portions 26 and 28 are indium tin oxide (ITO), aluminum zinc oxide (AZO), and gallium zinc oxide (GZO). Examples of conductive polymers capable of forming conductive portions 26 and 28 are the polymer known as PEDOT:PSS, which is a mixture of poly(3,4)-ethylenedioxythiophene and of sodium poly(styrene sulfonate), and polyaniline, also called PAni. Examples of metals capable of forming conductive portions 26 and 28 are silver (Ag), aluminum (Al), gold (Au), copper (Cu), nickel (Ni), titanium (Ti), and chromium (Cr). An example of a multilayer structure capable of forming conductive portions 26 and 28 is a multilayer AZO and silver structure of AZO/Ag/AZO type.

The thickness of conductive portions 26 and 28 may be in the range from 5 nm to 30 µm, for example, in the order of 150 nm. In the case where conductive portions 26, 28 are metallic and should be at least partially transparent, the thickness of conductive portions 26, 28 is smaller than or equal to 20 nm, preferably smaller than or equal to 10 nm. The minimum interval between conductive portion 26 and conductive portion 28 of photodetector Pix1, Pix2 is greater than or equal to 10 nm, preferably greater than or equal to 1 µm, more preferably in the range from 10 µm to 500 µm.

Interface layer 32 or 36 may correspond to an electron injection layer or to a hole injection layer according to whether the interface layer plays the role of a cathode or of an anode. The work function of interface layer 32 or 36 is capable of blocking, collecting, or injecting holes and/or electrons according to whether the interface layer plays the role of a cathode or of an anode. More particularly, when interface layer 32 or 36 plays the role of an anode, it corresponds to a hole injection and electron blocking layer. The work function of interface layer 32 or 36 is then greater than or equal to 4.5 eV, preferably greater than or equal to 5 eV. When interface layer 32 or 36 plays the role of a cathode, it corresponds to an electron injection and hole blocking layer. The work function of interface layer 32 or 36 is then smaller than or equal to 5 eV, preferably smaller than or equal to 4.2 eV.

In the case where interface layer 32 or 36 plays the role of an electron injection layer, the material forming interface layer 32 or 36 is selected from the group comprising:

a metal oxide, particularly a titanium oxide or a zinc oxide;

a molecular host/dopant system, particularly the products commercialized by Novaled under trade names NET-5/NDN-1 or NET-8/MDN-26;

a conductive or doped semiconductor polymer, for example, the PEDOT:Tosylate polymer which is a mixture of poly(3,4)-ethylenedioxythiophene and of tosylate;

a carbonate, for example $CsCO_3$; a polyelectrolyte, for example, poly[9,9-bis(3'-(N,N-dimethylamino)propyl)-2,7-fluorene-alt-2,7-(9,9-dioctyfluorene)] (PFN), poly[3-(6-trimethylammoniumhexyl] thiophene (P3TMAHT) or poly[9,9-bis(2-ethylhexyl)fluorene]-b-poly[3-(6-trimethylammoniumhexyl] thiophene (PF2/6-b-P3TMAHT);

a polyethyleneimine (PEI) polymer or a polyethyleneimine ethoxylated (PEIE), propoxylated, and/or butoxylated polymer; and a mixture of two or more of these materials.

Preferably, the first interface layer 32 plays the role of an electron injection layer and is made of a polyethyleneimine ethoxylated polymer. The thickness of interface layer 32 is preferably in the range from 0.1 nm to 500 nm. Preferably, interface layer 32 has an electric resistance greater than $10^9 \Omega/\square$, preferably greater than or equal to $10^{12} \Omega/\square$. The high electric resistance of interface layer 32 enables to avoid the forming of a short-circuit with conductive portions 26, 28.

In the case where interface layer 32 or 36 plays the role of a hole injection layer, the material forming interface layer 32 or 36 may be selected from the group comprising:

a conductive or doped semiconductor polymer, particularly the materials commercialized under trade names Plexcore OC RG-1100, Plexcore OC RG-1200 by Sigma-Aldrich, the PEDOT:PSS polymer or a polyaniline;

a molecular host/dopant system, particularly the products commercialized by Novaled under trade names NHT-5/NDP-2 or NHT-18/NDP-9;

a polyelectrolyte, for example, Nafion;

a metal oxide, for example, a molybdenum oxide, a vanadium oxide, ITO, or a nickel oxide; and a mixture of two or more of these materials.

Preferably, in the case where interface layer 32 or 36 plays the role of a hole injection layer, the material forming interface layer 32 or 36 is a conductive or doped semiconductor polymer.

Preferably, second interface layer 36 plays the role of a hole injection layer and is made of PEDOT:PSS. An advantage of PEDOT:PSS is that it may be easily deposited by printing techniques, for example, by inkjet, by heliography, by silk-screening, by slot-die coating, or by coating. Interface layer 36 provides a conductive path between diode D and photodiode PH. The thickness of interface layer 36 is preferably in the range from 10 nm to 50 µm. Preferably, interface layer 36 has an electric resistance smaller than 10 kΩ/□, preferably smaller than or equal to 1 kΩ/□. The low electric resistance of interface layer 36 enables to decrease the response time and to improve the linearity of the device.

Active layer 34 may comprise small molecules, oligomers, or polymers. These may be organic or inorganic materials. Active layer 34 may comprise an ambipolar semiconductor material, or a mixture of an N-type semiconductor material and of a P-type semiconductor material, for example in the form of stacked layers or of an intimate mixture at a nanometer scale to form a bulk heterojunction. The thickness of active layer 34 may be in the range from 50 nm to 1 µm, for example, in the order of 300 nm.

Example of P-type semiconductor polymers capable of forming active layer 34 are poly(3-hexylthiophene) (P3HT), poly[N-9'-heptadecanyl-2,7-carbazole-alt-5,5-(4,7-di-2-thienyl-2',1',3'-benzothiadiazole)] (PCDTBT), poly[(4,8-bis-(2-ethylhexyloxy)-benzo[1,2-b;4,5-b'] dithiophene)-2,6-diyl-alt-(4-(2-ethylhexanoyl)-thieno[3,4-b] thiophene))-2,6-diyl] (PBDTTT-C), poly[2-methoxy-5-(2-ethyl-hexyloxy)-1,4-phenylene-vinylene] (MEH-PPV), or poly[2,6-(4,4-bis-(2-ethylhexyl)-4H-cyclopenta [2,1-b;3,4-b']dithiophene)-alt-4,7(2,1,3-benzothiadiazole)] (PCPDTBT).

Examples of N-type semiconductor materials capable of forming active layer 34 are fullerenes, particularly C60, [6,6]-phenyl-$C_{61}$-methyl butanoate ([60]PCBM), [6,6]-phenyl-$C_{71}$-methyl butanoate ([70]PCBM), perylene diimide, zinc oxide (ZnO), or nanocrystals enabling to form quantum dots.

Insulating layer 38 may have a thickness in the range from 500 nm to 100 µm, for example, approximately 2 µm. Insulating layer 38 may have a single-layer structure or a multilayer structure. Insulating layer 38 may be made of a fluorinated polymer, particularly the fluorinated polymer commercialized under trade name Cytop by Bellex, of polyvinylpyrrolidone (PVP), of polymethyl methacrylate (PMMA), of polystyrene (PS), of parylene, of polyimide (PI), or of a mixture of at least two of these compounds. Layer 38 may be deposited in the form of a solution.

Opaque region 44 may be made of an ink based on carbon, of graphene, of a metal, or of a mixture or an alloy of at least two of these compounds. Opaque region 44 may have a thickness in the range from 10 nm to 100 µm, for example, approximately 10 µm.

Conductive bridge 46 may be made of a conductive material, for example, of PEDOT:PSS, of a silver ink, or of a carbon ink. The thickness of conductive bridge 46 may be in the range from 10 nm to 50 µm.

Insulating region 48 may be made of a dielectric material deposited in the form of a solution. The thickness of insulating region 48 may be in the range from 100 nm to 100 µm.

In the case where photodetector Pix1, Pix2 is intended to receive an illumination on the side of surface 24, as is the case for the embodiments shown in FIGS. 2 to 6, support 20, conductive portions 26, and first interface layer 32 are at least partly transparent to the electromagnetic radiation detected by the detection device. FIGS. 3 and 5 schematically show a radiation reaching photodetector Pix on the side of surface 24 by arrows 49. Second interface layer 36 and/or insulating layer 38 may then be at least partly opaque to the radiation to decrease risks of unwanted illumination of active layer 34 by surface 39. In the case where photodetector Pix1, Pix2 is intended to receive an illumination on the side of surface 39 of insulating layer 38, as occurs for embodiments described hereafter, insulating layer 38 and second interface layer 36 are made of at least partly transparent materials. Support 20, conductive portions 26, 28, and/or first interface layer 32 may then be at least partly opaque to the radiation to decrease risks of unwanted illumination of active layer 34 by surface 24. In the case where photodetector Pix1, Pix2 is intended to receive an illumination indifferently on the side of surface 24 or on the side of surface 39, support 20, conductive portions 26, 28, and insulating layer 38 are made of at least partly transparent materials.

Further, in the case where photodetector Pix1, Pix2 is intended to receive an illumination on the side of surface 39 of insulating layer 38 and in the case where support 20 is further at least partly transparent to the radiation received by the photodetector, conductive portions 26, 28 may be at least partly opaque to the radiation to decrease the propagation of light in support 20 all the way to diode D.

In operation, opaque region 44 prevents the radiation from reaching part of stack 30, which then operates as a diode while the reset of stack 30, which receives the radiation, operates as a photodiode PH. The material forming interface layer 36 is selected with a resistivity adapted so that substantially all the charges flow between conductive portions 26 and 28 by crossing active layer 34 of stack 30 twice, once in the portion of stack 30 screened by opaque region 44 and once in the portion of stack 30 receiving the electromagnetic radiation. A connection is thus effectively obtained between photodiode PH and diode D with a common anode or a common cathode. In FIGS. 3 and 5, the electric symbols of diode D and of photodiode PH have been added.

FIGS. 7A to 7E illustrates steps of an embodiment of a method of manufacturing photodetector Pix1.

Figure 7A:
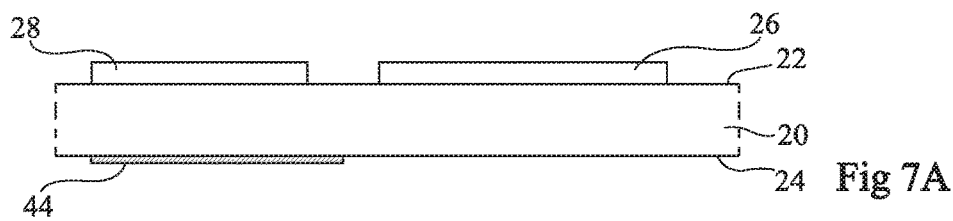
FIGS. 7A to 7E are partial simplified cross-section views of the structures obtained at successive steps of another embodiment of a method of manufacturing the photodetector shown in FIGS. 2 and 3.

FIG. 7A shows the structure obtained after having formed conductive portions 26 and 28 on surface 22 of support 20 and opaque region 44 on surface 24 of support 20.

According to the material used, the method of forming conductive portions 26, 28 and opaque region 44 may correspond to a so-called additive method, for example, by direct deposition of the material forming conductive portions 26, 28 or opaque region 44 at the desired locations. The deposition may be carried out by inkjet printing, photogravure, silk-screening, flexography, spray coating, or drop casting. The method of forming conductive portions 26, 28 and/or opaque region 44 may correspond to a so-called subtractive process, where a layer of the material forming conductive portions 26, 28 and/or opaque region 44 is deposited all over the structure (FIG. 4A) and where unused portions are then removed, for example, by photolithography or laser ablation. According to the considered material, the deposition over the entire structure may be performed, for example, by liquid deposition, by cathode sputtering, or by evaporation. Methods such as spin coating, spray coating, dipping, heliography, slot-die coating, blade coating, flexography, or silk-screening, may in particular be used. When conductive portions 26, 28 and/or opaque region 44 are metallic, the metal is for example deposited by evaporation or by cathode sputtering over the entire support 20 and conductive portions 26, 28 and/or opaque region 44 are delimited by etching. When the materials forming conductive portions 26, 28 are different, particularly when conductive portions 26 are opaque, conductive portions 26, 28 may be formed at different steps.

Figure 7B:
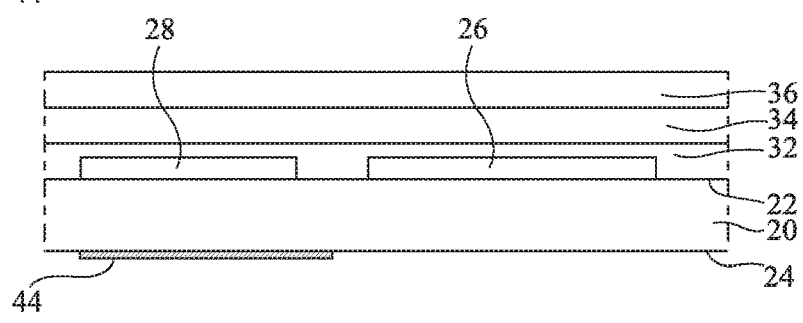

FIG. 7B shows the structure obtained after having successively deposited layers 32, 34, 36 all over support 20. Layers 34 and 36 may be formed by slot die coating. Layer 32 may be formed by dipping the structure into a bath of the material forming the considered layer, after having removed the structure from the bath, and after having dried the structure. An anneal step may be provided after the deposition of each layer 32, 34, or after the deposition of some of layers 32, 34, 36, particularly layer 32. A surface treatment may be provided after the deposition of each layer 32, 34, 36 or after the deposition of some of layers 32, 34, 36, particularly layer 34, to improve the deposition of the next structure. As an example, the surface treatment may comprise a step of cleaning with a plasma, for example, an oxygen plasma obtained by an inductive coupling plasma source comprising a radio frequency power generator having a power which may be 500 W, in a reactor at a pressure in the order of 133 Pa (approximately 1 Torr) for 1 minute.

Figure 7C:
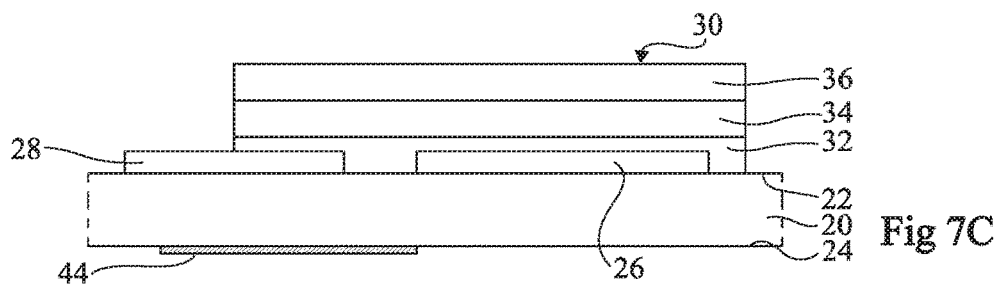

FIG. 7C shows the structure obtained after having etched layers 32, 34, and 36 to delimit stack 30. The etching may be a reactive ion etching (RIE). According to a variation, stack 30 may be formed by the previously-described additive deposition methods or other subtractive deposition methods.

Figure 7D:
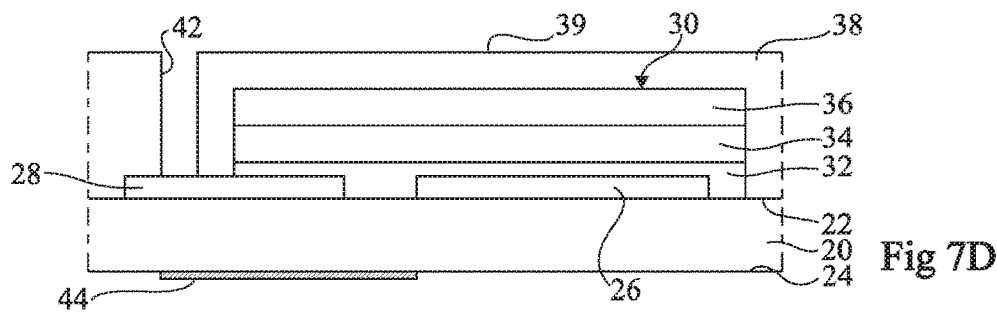

FIG. 7D shows the structure obtained after a step of deposition of insulating layer 38 all over the structure and a step of forming opening 42 in insulating layer 38 for each photodetector Pix1. Insulating layer 38 may be deposited according to the previously described additive deposition methods. Opening 42 may be formed by RIE.

Figure 7E:
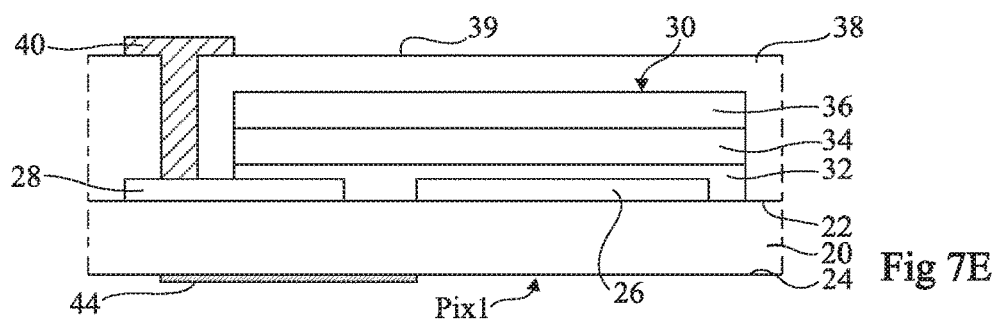

FIG. 7E shows the structure obtained after the forming of conductive element 40. Conductive element 40 may be deposited according to the previously-described additive or subtractive deposition methods.

The next steps of the manufacturing method particularly comprise the encapsulation of photodetectors Pix1, for example, by covering surfaces 24 and 39 of the structure shown in FIG. 7E of a protection layer, and possibly the sawing of support 20 to delimit detection device 10.

Advantageously, detection device 10 may be formed by printing techniques. The materials of conductive portions 26, 28, of layers 32, 34, 36, of conductive element 40, and/or of opaque region 44 may be deposited in liquid form, for example, in the form of conductive and semiconductor inks. "Materials in liquid form" here also designates gel materials capable of being deposited by printing techniques. Anneal steps may be provided between the depositions of the different layers, but it is possible for the anneal temperatures not to exceed 150° C., and the deposition and the possible anneals may be carried out at the atmospheric pressure.

Figure 8:
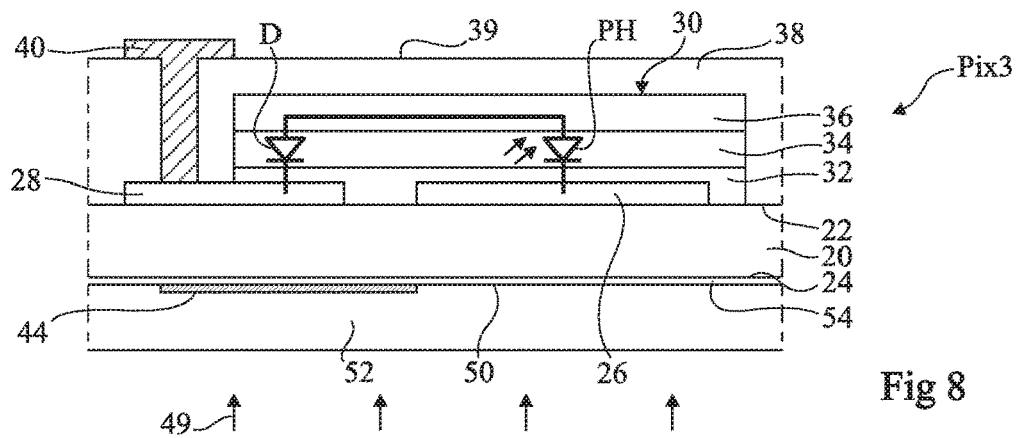
FIGS. 8 to 13 are views similar to FIG. 3 of other embodiments of a photodetector of the detection device of FIG. 1.
Figure 9:
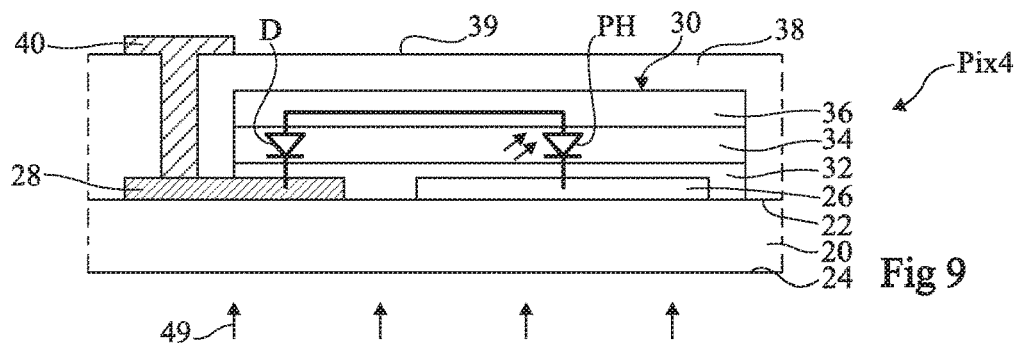

In the previously-described embodiment, the screening of diode D from the radiation received by the detection device is obtained by the forming of opaque region 44 on surface 24 of support 22. FIGS. 8 and 9 show other embodiments of the screening of diode D adapted to photodetectors intended to receive a light radiation on the side of surface 24 of support 20.

FIG. 8 shows another embodiment of a photodetector Pix3. Photodetector Pix3 comprises all the elements of photodetector Pix1, with the difference that opaque region 44 is not formed on surface 24 of support 20 but is provided on a surface 50 of a coating 52 bonded to surface 24. Coating 52 comprises a layer at least partly transparent to the radiation detected by photodiode PH, for example, a PET layer having a 125-µm thickness. Coating 52 may be bonded to support 20 by lamination, and a glue layer 54 may be interposed between layer 52 and surface 24.

FIG. 9 shows another embodiment of a photodetector Pix4. Photodetector Pix4 comprises all the elements of photodetector Pix1, with the difference that opaque region 44 is not present. The screening of diode D is performed by conductive portion 28, which is substantially opaque to the radiation detected by photodiode PH while conductive portion 26 is at least partially transparent to the radiation. According to an embodiment, conductive portion 28 is made of a material different from conductive portion 26. As an example, opaque conductive portion 28 is made of metallic materials or corresponds to a deposition of graphene or graphite type and transparent conductive portion 26 is made of TCO, of Ag nanowires, or of carbon nanotubes. The present embodiment advantageously enables to bring the screen closer to diode D.

The embodiments shown in FIGS. 10 to 13 are adapted to photodetectors intended to receive a light radiation on the side of surface 39 of insulating layer 38. These drawings schematically show with arrows 56 a radiation reaching the photodetector on the side of surface 39 of insulating layer 38.

Figure 10:
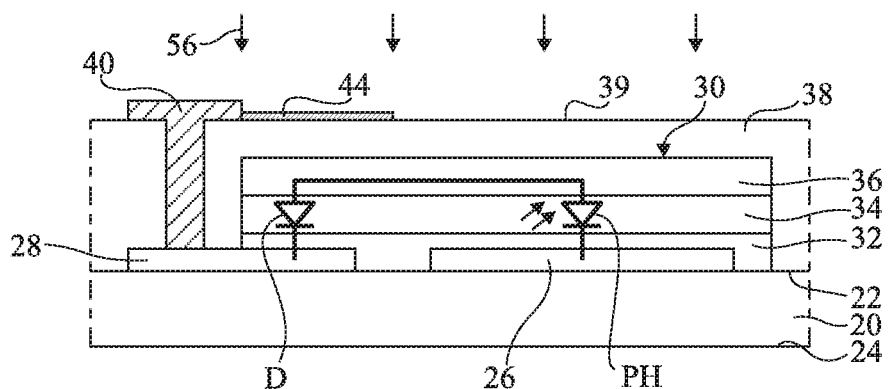

FIG. 10 shows another embodiment of a photodetector Pix5. Photodetector Pix5 comprises all the elements of photodetector Pix1, with the difference that opaque region 44 is not formed on surface 24 of support 20 but is provided on surface 39 of insulating layer 38.

Figure 11:
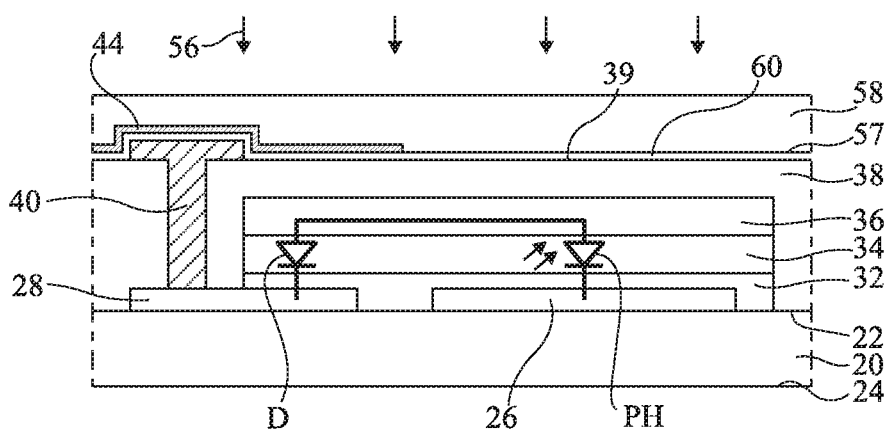

FIG. 11 shows another embodiment of a photodetector Pix6. Photodetector Pix6 comprises all the elements of photodetector Pix5, with the difference that opaque region 44 is not formed on surface 39 of insulating layer 38 but is provided on a surface 57 of a coating 58 bonded to surface 39 of insulating layer 38. Coating 58 comprises an insulating layer at least partly transparent to the radiation detected by photodiode PH, for example, a PET layer having a 125-µm thickness. Coating 58 may be bonded to insulating layer 38 by lamination, and a glue layer 60 may be interposed between coating 58 and insulating layer 38.

Figure 12:
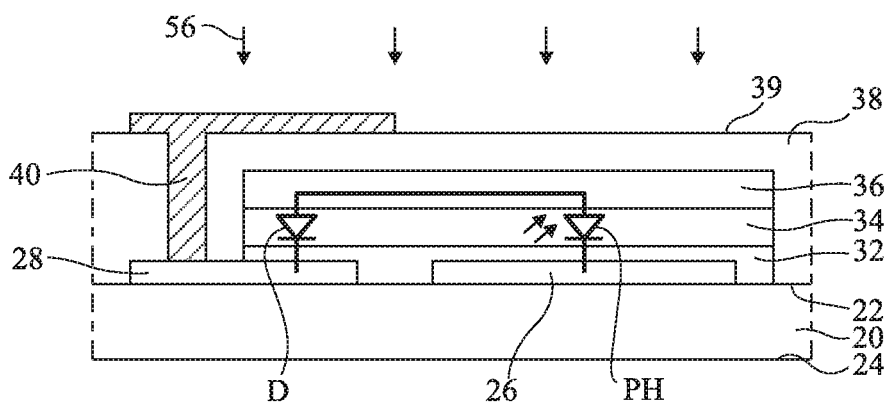

FIG. 12 shows another embodiment of a photodetector Pix7. Photodetector Pix7 comprises all the elements of photodetector Pix5, with the difference that the screening function performed by opaque region 44 for photodetector Pix5 is directly performed by conductive element 40 having its portion extending on surface 39 of layer 38 having a shape capable of preventing the radiation 56 received by photodetector Pix7 from reaching diode D. The method of manufacturing photodetector Pix7 advantageously comprises a small number of steps.

Figure 13:
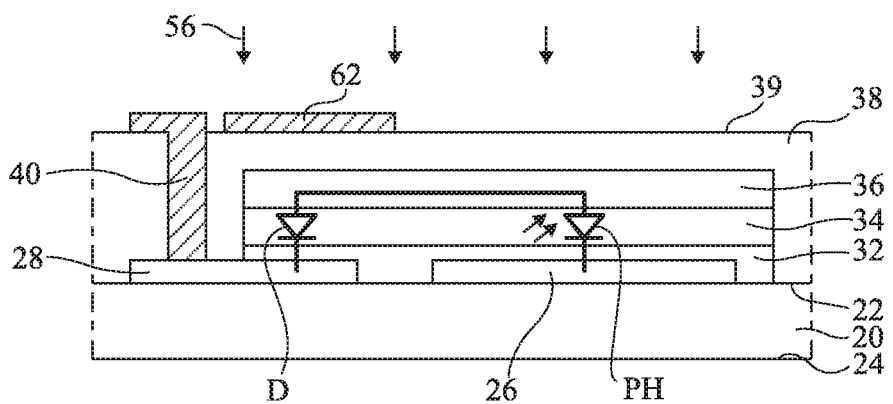

FIG. 13 shows another embodiment of a photodetector Pix8. Photodetector Pix8 comprises all the elements of photodetector Pix7, with the difference that the screening function is performed by a conductive region 62 located on surface 39 of insulating layer 38, which is made of the same material as conductive element 40 and is formed simultaneously to conductive element 40 but which is not electrically connected to conductive element 40. The present embodiment advantageously enables to avoid for opaque region 62 to degrade the conduction properties of conductive element 40, particularly by the injection of noise, during the operation of detection device 10.

Various embodiments with different variations have been described hereabove. It should be noted that those skilled in the art may combine these various embodiments and variations without showing any inventive step. In particular, the embodiments previously described in relation with FIGS. 8 to 11 may be implemented with the photodetector Pix2 previously described in relation with FIGS. 4 to 6. Further, in the case of a detection device capable of being exposed to a radiation both on the side of surface 24 of support 20 and on the side of surface 39 of insulating layer 38, a first opaque screen preventing the exposure of the diode D of each photodetector to a radiation may be provided on the side of surface 24 according to one of the embodiments previously described and shown in FIG. 2, 8, or 9 and a second opaque screen preventing the exposure of the diode D of each photodetector to a radiation may be provided on the side of surface 39 according to one of the embodiments previously described and shown in FIGS. 10 to 13.

The invention claimed is:

1. A device for detecting an electromagnetic radiation, the device comprising at least one photodetector comprising an organic diode, different from a light-emitting diode, an organic photodiode formed in a same stack of semiconductor layers as the organic diode, the organic photodiode receiving said radiation, at least one screen opaque to said radiation and screening the portion of the stack of semiconductor layers corresponding to the organic diode, a support, a first conductive portion extending over the support and a second conductive portion extending over the support, the stack of semiconductor layers at least partially covering the first conductive portion and at least partially covering the second conductive portion, a minimum distance between the first conductive portion and the second conductive portion being greater than 10 nm.

2. The detection device of claim 1, wherein an anode of the diode is connected to an anode of the photodiode or a cathode of the diode is connected to a cathode of the photodiode.

3. The detection device of claim 1, wherein the at least one opaque screen is located on a side of the support opposite to the first and second conductive portions.

4. The detection device of claim 1, wherein the first conductive portion is at least partially transparent to the radiation and the second conductive portion is opaque to the radiation.

5. The detection device of claim 1, further comprising an insulating layer covering the stack of semiconductor layers, the opaque screen being located on the insulating layer, on a side of the insulating layer opposite to the stack of semiconductor layers.

6. The detection device of claim 5, further comprising a conductive element extending over the insulating layer and through the insulating layer, the conductive element being in contact with the first conductive portion or with the second conductive portion, the conductive element further forming the opaque screen.

7. The detection device of claim 1, wherein the at least one photodetector comprises an array of photodetectors distributed in rows and in columns.

8. The detection device of claim 1, wherein the stack of semiconductor layers comprises at least first, second, and third semiconductor layers, the second semiconductor layer being interposed between the first semiconductor layer and the third semiconductor layer and being in contact with the first semiconductor layer and with the third semiconductor layer, the second semiconductor layer being the layer having most of the radiation received by the photodiode captured therein.

9. The detection device of claim 8, wherein the first semiconductor layer is in contact with the first conductive portion and with the second conductive portion.

10. The detection device of claim 8, wherein the first semiconductor layer and/or the third semiconductor layer is made of a material comprising:

a metal oxide;

a molecular host/dopant system;

a conductive or doped semiconductor polymer;

a carbonate;

a polyelectrolyte;

a polyethyleneimine (PEI) polymer or a polyethyleneimine ethoxylated (PEIE), propoxylated, and/or butoxylated polymer; or a mixture of two or more of these materials.

11. The detection device of claim 10, wherein:

the metal oxide is a titanium oxide or a zinc oxide;

the molecular host/dopant system is NET-5/NDN-1 or NET-8/MDN-26;

the conductive or doped semiconductor polymer is PEDOT:Tosylate polymer which is a mixture of poly (3,4)-ethylenedioxythiophene and of tosylate;

the carbonate is CsCO3; and the polyelectrolyte is poly[9,9-bis(3'-(N,N-dimethylamino)propyl)-2,7-fluorene-alt-2,7-(9,9-dioctyfluorene)] (PFN), poly[3-(6-trimethylammoniumhexyl] thiophene (P3TMAHT) or poly [9,9-bis(2-ethylhexyl) fluorene]-b-poly [3-(6-trimethyl-ammoniumhexyl] thiophene (PF2/6-b -P3TMAHT).

* * * * *